United States Patent
Lai et al.

(10) Patent No.: US 12,009,327 B2
(45) Date of Patent: Jun. 11, 2024

(54) SEMICONDUCTOR DIE

(71) Applicant: Taiwan Semiconductor Manufacturing Company, Ltd., Hsinchu (TW)

(72) Inventors: Yen-Kun Lai, New Taipei (TW); Chien-Hao Hsu, Hsinchu County (TW); Wei-Hsiang Tu, Hsinchu (TW); Kuo-Chin Chang, Chiayi (TW); Mirng-Ji Lii, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 277 days.

(21) Appl. No.: 17/461,952

(22) Filed: Aug. 30, 2021

(65) Prior Publication Data
US 2023/0060249 A1    Mar. 2, 2023

(51) Int. Cl.
*H01L 23/00* (2006.01)
*H01L 23/522* (2006.01)

(52) U.S. Cl.
CPC .......... *H01L 24/13* (2013.01); *H01L 23/5226* (2013.01); *H01L 24/05* (2013.01); *H01L 2224/02206* (2013.01); *H01L 2224/02372* (2013.01); *H01L 2224/0401* (2013.01); *H01L 2224/13017* (2013.01)

(58) Field of Classification Search
CPC ...................................................... H01L 24/13
See application file for complete search history.

(56) References Cited

U.S. PATENT DOCUMENTS

| 9,666,546 B1 | 5/2017 | Schneegans et al. |
| 2011/0115073 A1* | 5/2011 | Chen ........................ H01L 24/05 257/E21.59 |

OTHER PUBLICATIONS

"Office Action of Taiwan Counterpart Application", dated Nov. 17, 2022, p. 1-p. 6.

* cited by examiner

*Primary Examiner* — William A Harriston
(74) *Attorney, Agent, or Firm* — JCIPRNET

(57) ABSTRACT

A semiconductor die includes a semiconductor substrate, an interconnect structure, and a conductive bump. The interconnect structure is disposed on and electrically connected to the semiconductor substrate. The interconnect structure includes stacked interconnect layers. Each of the stacked interconnect layers includes a dielectric layer and an interconnect wiring embedded in the dielectric layer. The interconnect wiring of a first interconnect layer among the stacked interconnect layers further includes a first via and second vias. The first via electrically connected to the interconnect wiring. The second vias connected to the interconnect wiring, and the first via and the second vias are located on a same level height. The conductive bump is disposed on the interconnect structure. The conductive bump includes a base portion and a protruding portion connected to the base portion, and the base portion is between the protruding portion and the first via.

20 Claims, 12 Drawing Sheets

SEMICONDUCTOR DIE

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

A semiconductor die may comprise a plurality of solder balls formed on a plurality of under bump metal (UBM) openings. Alternatively, copper bumps may be employed to electrically connect the semiconductor die with external circuits. There may be a concentration of stress centered around the areas adjacent to the connection structure of the semiconductor die.

BRIEF DESCRIPTION OF THE DRAWINGS

Aspects of the present application are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DESCRIPTION OF THE EMBODIMENTS

Figure 1:
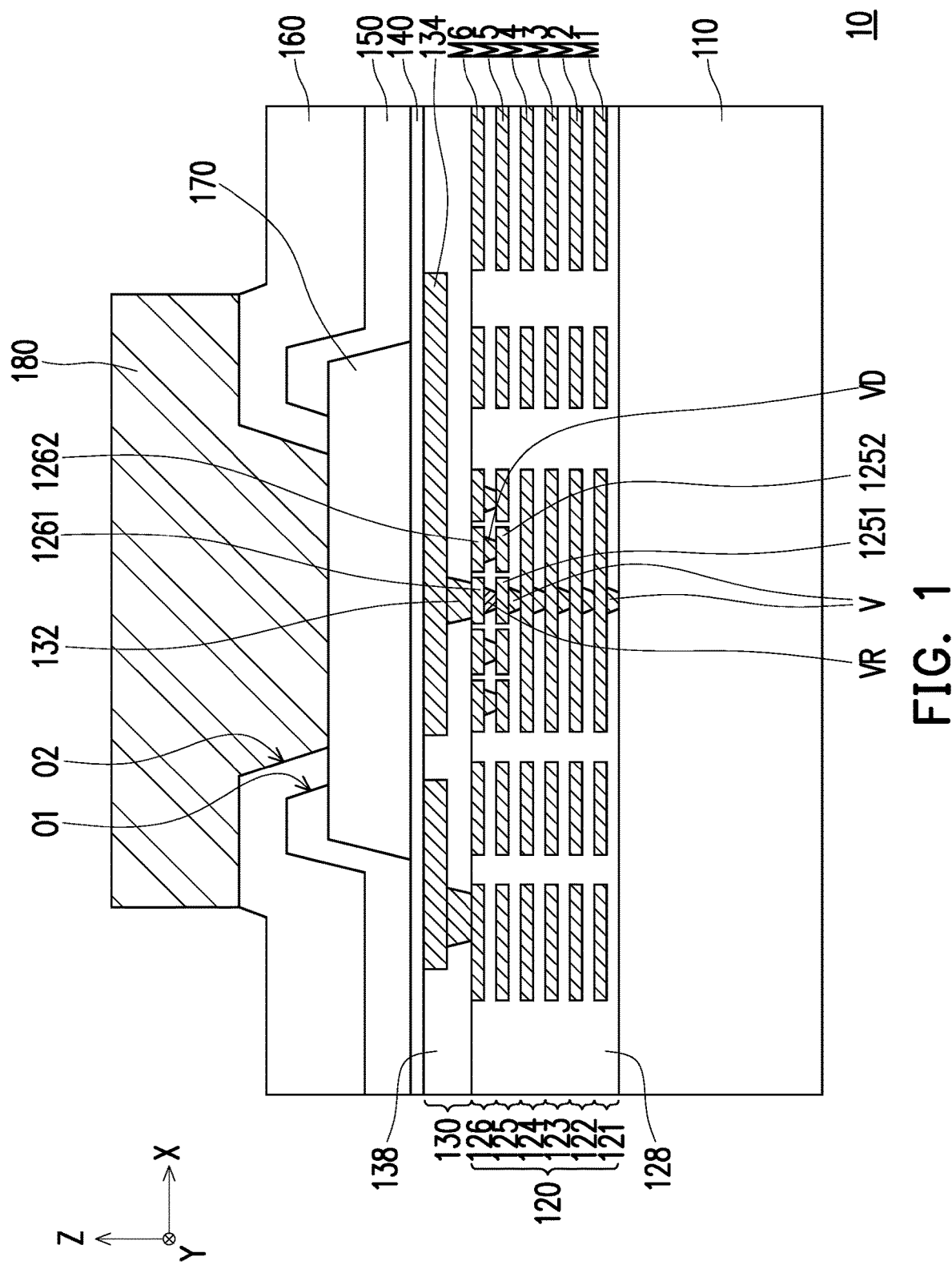
FIG. 1 illustrates a schematic cross sectional view of the semiconductor die in accordance with some embodiments of the present application.

The following disclosure provides many different embodiments, or examples, for implementing different features of the invention. Specific examples of components and arrangements are described below to simplify the present application. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present application may repeat reference numerals and/or letters in the various examples. Throughout the description, unless otherwise specified, like reference numerals in different figures refer to the same or similar component formed by a same or similar method using a same or similar material(s).

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, an interconnect structure of a semiconductor die. The disclosure may also be applied, however, to a variety of semiconductor devices.

FIG. 1 illustrates a schematic cross sectional view of the semiconductor die in accordance with some embodiments of the present application. Referring to FIG. 1, a semiconductor die 10 including a substrate 110, an interconnect structure 120, a top conductive layer 130, a conductive pad 170, and a conductive bump 180 is provided. The semiconductor die 10 may be used in a System on Integrated System (SoIS) package, a system-on-chip (SoC) package, a package-on-package (PoP), a chip on wafer (CoW) package, or a chip on wafer on substrate (CoWoS) package, but not limited thereto.

In some embodiments, the substrate 110 may be referred as a semiconductor substrate 110. The semiconductor substrate 110 is a doped silicon substrate, an undoped silicon substrate, or an active layer of a silicon-on-insulator (SOI) substrate. In some other embodiments, the substrate 100 is a glass substrate, a ceramic substrate, a polymer substrate, or any other substrate that may provide a suitable protection and/or interconnection functionality. In accordance to an embodiment of the present application, the semiconductor substrate 110 is a silicon substrate including a variety of electrical circuits (not shown). The electrical circuits formed on the semiconductor substrate 110 may be any type of circuitry suitable for a particular application.

In some embodiments, the electrical circuits include various n-type metal-oxide semiconductor (NMOS) and/or p-type metal-oxide semiconductor (PMOS) devices, such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like. Persons of ordinary skill in the art will appreciate that the above examples are provided for illustrative purposes only to further explain applications of the present disclosure and are not meant to limit the present disclosure in any manner.

The interconnect structure 120 is disposed on and electrically connected to the semiconductor substrate 110. The interconnect structure 120 is a stacked structure of alternating dielectric layers and interconnect wirings. From another perspective, the interconnect structure 120 is composed of stacked interconnect layers 121, 122, 123, 124, 125, 126. For example, the interconnect structure 120 includes interconnect layer 121, interconnect layer 122, interconnect layer 123, interconnect layer 124, interconnect layer 125, and interconnect layer 126. The interconnect layer 121 is disposed on the semiconductor substrate 110 on the Z-axis. The interconnect layer 122 is disposed on the interconnect layer 121 on the Z-axis. The interconnect layer 123, the interconnect layer 124, the interconnect layer 125, and the interconnect layer 126 are subsequently sequentially stacked on one another on the Z-axis, but not limited thereto. In some embodiments, the Z-axis is a normal direction of the substrate 110. In addition, an X-axis and a Y-axis are perpendicular to the Z-axis, and the X-axis is perpendicular to the Y-axis. It should be noted that, in FIG. 1, the interconnect structure 120 is shown as a stacked interconnect structure of six interconnect layers, however the number of the stacked interconnect layers is not limited thereto. In some other embodiments, the number of the interconnect layers in the interconnect structure 120 is two, three, four, five, seven, eight, ten, twenty or more or other suitable numbers. Persons of ordinary skill in the art will appreciate that the above examples are provided for illustrative purposes only to further explain applications of the present disclosure and are not meant to limit the present disclosure in any manner. In some other embodiments, the number of the redistribution layers in the interconnect structure 120 is one, but not limited thereto.

Each of the stacked interconnect layers includes a dielectric layer and an interconnect wiring embedded in the dielectric layer. For example, the interconnect layer 121 includes a dielectric layer 128, and an interconnect wiring M1. The interconnect wiring M1 is embedded in the dielectric layer 128. In some embodiments, the martial of the dielectric layer 128 is low-k dielectric materials, such as silicon oxide, carbon doped oxide or other suitable material. In some other embodiments, the material of the dielectric layer 128 is extreme low-k (ELK) materials, such as porous carbon doped silicon dioxide or other suitable materials, but not limited thereto. In accordance to an embodiment of the present application, the dielectric constant of the extreme low-k material is between 2.0 to 3.0. The dielectric layer 128 may be formed by spin coating, printing, physical vapor deposition (PVD), chemical vapor deposition (CVD), or plasma enhanced chemical vapor deposition (PECVD), but not limited thereto.

The interconnect wiring M1 is formed over the dielectric layer 128, and may be embedded in the dielectric layer 128. The interconnect wiring M1 may include metal circuits and metal pads. The material of the interconnect wiring M1 may include cooper, cooper alloy, aluminum, aluminum alloy, molybdenum, tantalum, niobium, hafnium, nickel, chromium, cobalt, zirconium, tungsten, other suitable metal, or alloys or combinations of the aforementioned metals, but not limited thereto. The interconnect wiring M1 may be formed through deposition, damascene or other suitable methods, but not limited thereto.

In some embodiments, the dielectric layer of the interconnect layer 122 is disposed on the interconnect wiring M1, and the interconnect wiring M2 is disposed on the dielectric layer of the interconnect layer 122. In other words, the dielectric layers 128 and the corresponding interconnect wirings M1, M2, M3, M4, M5, M6 are alternatively stacked on each other, and the dielectric layers 128 of each of the interconnect layers 121, 122, 123, 124, 125, 126 are used to separate the interconnect wirings M1, M2, M3, M4, M5, M6. Thereby, the multilayered stack of interconnect layers 121, 122, 123, 124, 125, 126 may be configured into the interconnect structure 120. In some embodiments, the interconnect wirings M1, M2, M3, M4, M5, M6 are used to connect the electrical circuits in the semiconductor substrate 110, so as to form functional circuitry and to further provide an external electrical connection, but not limited thereto.

Each of the interconnect layers 121, 122, 123, 124, 125, 126 may include a conductive via adapted to interconnect the interconnect layers 121, 122, 123, 124, 125, 126 and form an electrical path connecting the electrical circuits in the substrate 110. For example, the bottommost redistribution layer 121 includes a third via V embedded in the dielectric layer 128. The third via V electrically connected to the interconnect wiring M1. The third via V may connect to the electrically circuitry in the substrate 110. The material of the third via V may include cooper, cooper alloy, aluminum, aluminum alloy, molybdenum, tantalum, niobium, hafnium, nickel, chromium, cobalt, zirconium, tungsten, other suitable metal, or alloys or combinations of the aforementioned metals, but not limited thereto. The third via V may be formed through plating, deposition, damascene or other suitable methods, but not limited thereto.

Similarly, the interconnect layers 122, 123, 124, 125 may each include a third via V. The third vias V may be aligned along the Z-axis and overlap each other. Each of the third vias V correspondingly electrically connects the interconnect wirings M2, M3, M4, M5 to the interconnect wiring M1.

In some embodiments, the topmost interconnect layer 126 (may be referred to as the first interconnect layer) of the interconnect structure 120 is disposed over the interconnect layer 125 (may be referred to as the second interconnect layer). The topmost interconnect layer 126 further includes vias. These vias may be adapted for circuit redistribution, but not limited thereto. These vias include a first via VR adapted for electrically signal conduction. In other words, the first via VR may be referred as conduction via. In the interconnect layer 126, the first via VR is connected to the interconnect wiring M6 (may be referred to as the first interconnect wiring). The first via VR is disposed between the interconnect wiring M6 and the interconnect wiring M5 (may be referred to as the second interconnect wiring). The first via VR is electrically connected to the interconnect wiring M6 and the interconnect wiring M5. In the above configuration, the first via VR may connect the interconnect layer 126 to the interconnect layer 125, and form the electrical path along with the third vias V. In some embodiments, the third vias V are overlapped with the first via VR along the Z-axis, but not limited thereto. In the above configurations, the electrical path formed by the first via VR and the third vias V may form a substantially straight line along the Z-axis, but not limited thereto.

The vias of the topmost interconnect layer 126 (i.e. the first interconnect layer) may further include second vias VD spaced apart from each other. The second vias VD are connected to the interconnect wiring M6 of the interconnect layer 126. In some embodiments, the second vias VD are connected to the interconnect wiring M5 of the interconnect layer 125 (i.e. the second interconnect layer), but not limited thereto. For example, the second vias VD may not be disposed over the interconnect wiring M5 and are not connected thereto. As shown in FIG. 1, the second vias VD are disposed between the interconnect wiring M6 and the interconnect wiring M5.

The second vias VD are disposed on a substantially similar horizontal plane as the first via VR, that is, the first via VR and the second vias VD are on a same level height. The second vias VD may surround the first via VR, but not limited thereto. In some embodiments, the second vias VD are embedded in the dielectric layer 128 of the topmost dielectric layer 126. The second vias VD may be disposed along the X-axis and the Y-axis, but the limited thereto. The first via VR is spaced apart from the second vias VD, and the first vias VR may be separated from the second vias VD by the dielectric layer 128. In some embodiments, the second vias VD are electrically insulated from the first via VR. In some other embodiments, the second vias VD are not adapted for conducting electrical signals. Therefore, the second vias VD may be referred to as dummy vias, floating vias or stress releasing vias. Depending on the users' designs or requirements, the second vias VD may have electrical properties and serve as a part of the electrical path, or may not be used in the electrical circuitry operations of the semiconductor die 10, but not limited thereto.

In some embodiments, the materials of the first via VR and the second vias VD may be the same or different. For examples, the materials may include cooper, cooper alloy, aluminum, aluminum alloy, molybdenum, tantalum, niobium, hafnium, nickel, chromium, cobalt, zirconium, tungsten, other suitable metal, or alloys or combinations of the aforementioned metals, but not limited thereto.

In some embodiments, the interconnect wiring M6 of the interconnect layer 126 (i.e. the topmost interconnect layer 126, also known as the first interconnect layer) includes a conductive portion 1261 and peripheral portions 1262. In accordance to an embodiment of the present application, the conductive portion 1261 may be referred as the first conductive portion 1261 and the peripheral portion 1262 may be referred as the first peripheral portion 1262. The conductive portion 1261 may be a metal trace or a metal pad that can electrically connect to the first via VR. Therefore, the conductive portion 1261 may serve as a part of the electrical path connecting to the third vias V and the electrical circuits in the semiconductor substrate 110. In some embodiments, the conductive portion 1261 is embedded in the top surface of the interconnect layer 126. The conductive portion 1261 may be coplanar with the top surface of the interconnect layer 126, but not limited thereto.

The peripheral portions 1262 may be metal traces or metal pads that can electrically connect to the second vias VD. In some embodiments, the peripheral portions 1262 are embedded in the top surface of the interconnect layer 126. The peripheral portions 1262 may be coplanar with the top surface of the interconnect layer 126, but not limited thereto. Please refer to FIG. 1, the peripheral portions 1262 may be physically separated from the conductive portion 1261. That is to say, the conductive portion 1261 is electrically insulated from the peripheral portion 1262. In the above configurations, the peripheral portions 1262 are electrically insulated from the first via VR and the third vias V, which may form the electrical path connected to the electrical circuits in the semiconductor substrate 110. In addition, the second vias VD connected to the peripheral portions 1262 are also electrically insulated from the conductive portion 1261, therefore the second vias VD and the peripheral portions would not affect the electrical quality of the semiconductor die 10.

In some embodiments, each of the peripheral portions 1262 is spaced apart from each other. Each of the second vias VD correspondingly connects to one of the peripheral portions 1262, but not limited thereto. In some other embodiments, several second vias VD are connected to the same peripheral portions 1262.

In some embodiments, the interconnect wiring M5 of the interconnect layer 125 (i.e. the interconnect layer 125 under the topmost interconnect layer 126, also known as the second interconnect layer) includes a conductive portion 1251 and peripheral portions 1252. In accordance to an embodiment of the present application, the conductive portion 1251 may be referred as the second conductive portion 1251 and the peripheral portion 1252 may be referred as the second peripheral portion 1252. The conductive portion 1251 may be a metal trace or a metal pad that can electrically connect to the first via VR above the conductive portion 1251, and the third via V under the conductive portion 1251. Therefore, the conductive portion 1251 may serve as a part of the electrical path connecting to the third vias V and the electrical circuits in the semiconductor substrate 110.

The peripheral portions 1252 may be metal traces or metal pads that can electrically connect to the second vias VD above the peripheral portions 1252. The peripheral portions 1252 may be physically separated from the conductive portion 1251. That is to say, the conductive portion 1251 is electrically insulated from the peripheral portion 1252. In the above configurations, the peripheral portions 1262 are connected to the peripheral portions 1252 by the second vias VD, and are electrically insulated from the conductive portions 1261, 1251, and the first via VR of the electrical path. Therefore, the second vias VD, the peripheral portions 1262, 1252 may not affect the electrical quality of the semiconductor die 10.

It is worth noting that, the second vias VD may be used to provide support and to reduce or release stress for the first via VR, that is to say, the second vias VD may serve as stress release vias. Therefore, the risk of cracking the first via VR, the dielectric layer 128 of the topmost interconnect layer 126, and the conductive portions 1251, 1261 may be reduced. Thereby, the quality of the semiconductor die 10 may be improved.

In some embodiments, the semiconductor die 10 further includes the top conductive layer 130 disposed on the interconnect structure 120. For example, the top conductive layer 130 is disposed on the topmost interconnect layer 126. The top conductive layer 130 includes an insulating layer 138 and a metallization pattern 134. The metallization pattern 134 is embedded in the insulating layer 138, and the metallization pattern 134 may be substantially coplanar with the top surface of the insulating layer 138, but not limited thereto. The metallization pattern 134 may be metal traces or metal pads. The material of the metallization pattern 134 may include cooper, cooper alloy, aluminum, aluminum alloy, molybdenum, tantalum, niobium, hafnium, nickel, chromium, cobalt, zirconium, tungsten, other suitable metal, or alloys or combinations of the aforementioned metals, but not limited thereto. The material of the insulating layer 138 may be non-organic materials such as undoped silicate glass, silicon nitride, silicon oxide, silicon oxynitride, or other suitable materials. Alternatively, the material of the insulating layer 138 may be low-k dielectric material, or extremely low-k materials, but not limited thereto.

In some embodiments, a dielectric constant of the insulating layer 138 may be the same or different from the dielectric constant of the dielectric layer 128. In accordance to an embodiment of the present application, the dielectric constant of the dielectric layer 128 of the interconnect layer 126 is less than the dielectric constant of the insulating layer 138.

The conductive layer 130 of the semiconductor die 10 further includes a metallization via 132. The metallization via 132 is electrically connected to the interconnect structure 120. For example, the metallization via 132 is embedded in the insulating layer 138. The metallization via 132 is disposed over the conductive portion 1261 of the interconnect wiring M6 of the interconnect layer 126. The metallization via 132 is disposed between the conductive portion 1261 and the metallization pattern 134. Thereby, the metallization via 132 may electrically connect the conductive portion 1261 of the interconnect structure 120 to the metallization pattern 134 of the conductive layer 130. That is to say, the metallization via 132 and the metallization pattern 134 may be parts of the electrical path connecting to the electrical circuits in the semiconductor substrate 110.

In some embodiments, the materials of the metallization via 132 include cooper, cooper alloy, aluminum, aluminum alloy, molybdenum, tantalum, niobium, hafnium, nickel, chromium, cobalt, zirconium, tungsten, other suitable metal, or alloys or combinations of the aforementioned metals, but not limited thereto.

In some embodiments, the semiconductor die 10 further includes a first passivation layer 140 is optionally disposed over the conductive layer 130 on the interconnect structure 120, but not limited thereto. The materials of the first passivation layer 140 may be silicon nitride, silicon oxide, silicon oxynitride, or other suitable materials, but not limited thereto.

The conductive pad 170 is disposed on the first passivation layer 140. In some embodiments, the conductive pad 170 is disposed between the interconnect structure 120 and the conductive bump 180. In some embodiments, the conductive pad 170 is disposed over the insulating layer 138 of the conductive layer 130 on the interconnect structure 120. Alternatively, the metallization pattern 134 and the insulating layer 138 of the conductive layer 130 is between the interconnect structure 120 and the conductive pad 170. The conductive pad 170 is electrically connected to the metallization pattern 134. In some embodiments, the conductive pad 170 is directly disposed on metallization pattern 134.

The semiconductor die 10 further includes a second passivation layer 150 insulating layer 160. The second passivation layer 150 is disposed on the first passivation layer 140. In some embodiments, the second passivation layer 150 is partially disposed on the conductive pad 170. The materials of the second passivation layer 150 may be substantially the same as the materials of the first passivation layer 140, but not limited thereto.

The insulating layer 160 is disposed on the second passivation layer 150 and partially on the conductive pad 170. The materials of the insulating layer 160 may include polyimide, but not limited thereto. In another embodiment, the insulating layer 160 includes photo-definable polyimide materials such as HD4104, but not limited thereto.

The conductive pad 170 is embedded in the second passivation layer 150 and the insulating layer 160. For example, the second passivation layer 150 and the insulating layer 160 partially cover the bond pad 170. In the above configurations, the second passivation layer 150 and the insulating layer 160 may seal the edges of the bond pad 170 so as to improve electrical stability by preventing the edges of the bond pad 170 from corrosion.

The second passivation layer 150 has an opening O1. The insulating layer 160 has an opening O2. The opening O1 overlaps with the opening O2. In the Z-axis, the outer edge of the opening O2 is in the outer edge of the opening O1. A top surface of the conductive pad 170 is exposed by the opening O1 and the opening O2. In some embodiments, the opening O2 is used to define an area exposing the conductive pad 170.

In some embodiments, an area of an orthogonal projection of the conductive pad 170 on the semiconductor substrate 110 is larger than an area of an orthogonal projection of the top metal via 132 on the semiconductor substrate 110. The orthogonal projections on the semiconductor substrate 110 are defined as the projection on the semiconductor substrate 110 along the Z-axis. The area of the orthogonal projection of metallization via 132 on the semiconductor substrate 110 is larger than an orthogonal projection of the first via VR on the semiconductor substrate 110, but not limited thereto.

The semiconductor die 10 further includes a conductive bump 180. The conductive bump 180 is disposed on the conductive pad 170 on the interconnect structure 120. The conductive bump 180 is used to connect the semiconductor die 10 to other electrical devices (not shown). The conductive bump 180 includes controlled collapse chip connection (C4) bumps, or other suitable terminals for providing external connections to other electrical devices. Other possible forms and shapes of the conductive bump 180 may be utilized according to design requirements.

The conductive bump 180 is disposed over the second passivation layer 150 and the insulating layer 160. The conductive bump 180 includes a base portion 182 and a protruding portion 181. The conductive bump 180 is overlapped with the opening O1 and the opening O2. The base portion 182 of the conductive bump 180 is disposed in the opening O1 and the opening O2. The protruding portion 181 is partially disposed over the insulating layer 160. The protruding portion 181 is connected to the base portion 182. The base portion 182 is between the protruding portion 181 and the first via VR. The base portion 182 of the conductive bump 180 is electrically connected to the conductive pad 170.

It is worth noting that, the base portion 182 of the conductive bump 180 and the metallization via 132 are overlapped in the Z-axis in the area defined by the opening O2. Alternatively, an orthogonal projection of the first via VR on the semiconductor substrate 110 is in an orthogonal projection of the conductive bump 180, an orthogonal projection of the conductive pad 170, an orthogonal projection of the metallization pattern 134, and the orthogonal projection of the metallization via 132 on the semiconductor substrate 110. In addition, the orthogonal projection of the first via VR on the semiconductor substrate 110 overlaps the orthogonal projections of the third vias V on the substrate 110. Therefore, the first via VR and the third vias V may experience stress from the conductive bump 180, the conductive pad 170, the metallization pattern 134, and the metallization via 132 centering around the area defined by the opening O2.

However, in an embodiment of the present application, the second vias VD (i.e. the stress releasing vias) are disposed adjacent to the first vias VR under the base portion 182 in the opening O2. Specifically, the orthogonal projections of the first via VR and the second vias VD on the semiconductor substrate 110 are in orthogonal projections of the base portion 182 and the opening O2 on the semiconductor substrate 110. Under the above configurations, the orthogonal projections of the first via VR and the second vias VD on the semiconductor substrate 110 are in the orthogonal projections of the conductive bump 180, and the conductive pad 170 on the semiconductor substrate 110 (i.e. the conductive bump 180 and the conductive pad 170 overlap with the first via VR and the second vias VD), thereby the second vias VD are used to support the first via VR. In other words, the stress is dispersed from the first via VR and released to the second vias VD. Thus, the stress acting on the first via VR and third vias V under the first via VR is reduced. Therefore, the risk of cracking the first via VR, the topmost dielectric layer 128, the conductive portion 1251, 1261, and third vias V3 is reduced, and the structural quality and the electrical quality of the semiconductor die 10 are improved.

Figure 2:
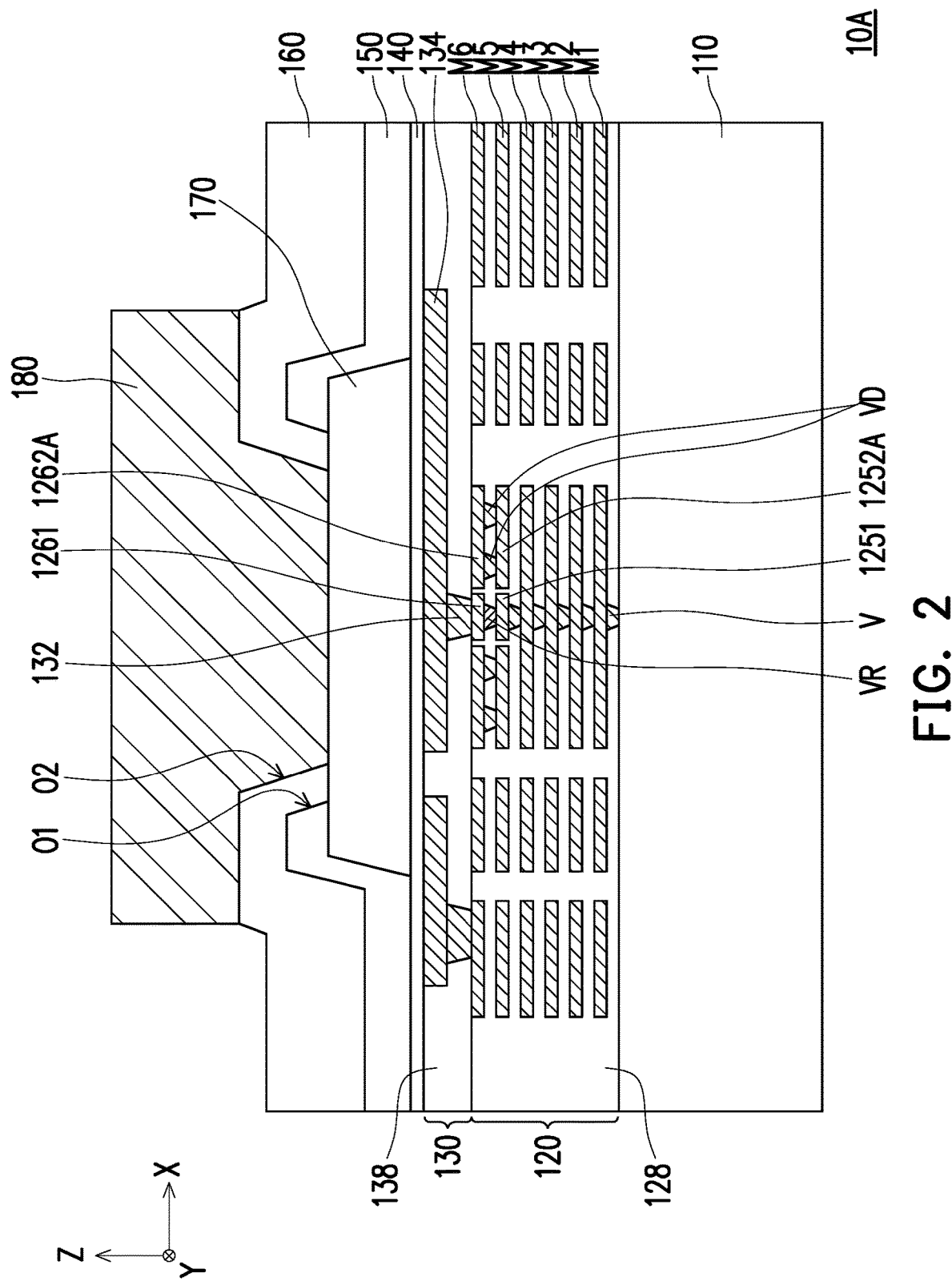
FIG. 2 illustrates a schematic cross sectional view of the semiconductor die in accordance with some other embodiments of the present application.

FIG. 2 illustrates a schematic cross sectional view of the semiconductor die in accordance with some other embodiments of the present application. In some embodiments, the semiconductor die 10A of FIG. 2 is similar to the semiconductor die 10 illustrated in FIG. 1, except that several second vias VD are connected to the interconnect wiring M6 and are connected to each other. Specifically, the interconnected wiring M6 includes a conductive portion 1261 and peripheral portions 1262. Each of the peripheral portions 1262 may connect several second vias VD, thereby connecting several second vias VD together. In some embodiments, the interconnect wiring M5 includes a conductive portion 1251 and peripheral portions 1252. Several second vias VD are between the peripheral portion 1262 and the corresponding peripheral portion 1252. The second vias VD connect the peripheral portion 1262 to the peripheral portion 1252. The second vias VD and the peripheral portions 1252, 1262 may be respectively electrically insulated from the first via VR and the conduction portions 1251, 1261, but not limited thereto. In some other embodiments, the second vias VD are adapted to conduct electrical signals similar to the first via VR. Other possible patterns and connections of the second vias VD and the peripheral portions 1252, 1262 may be utilized according to design requirements.

Figure 3:
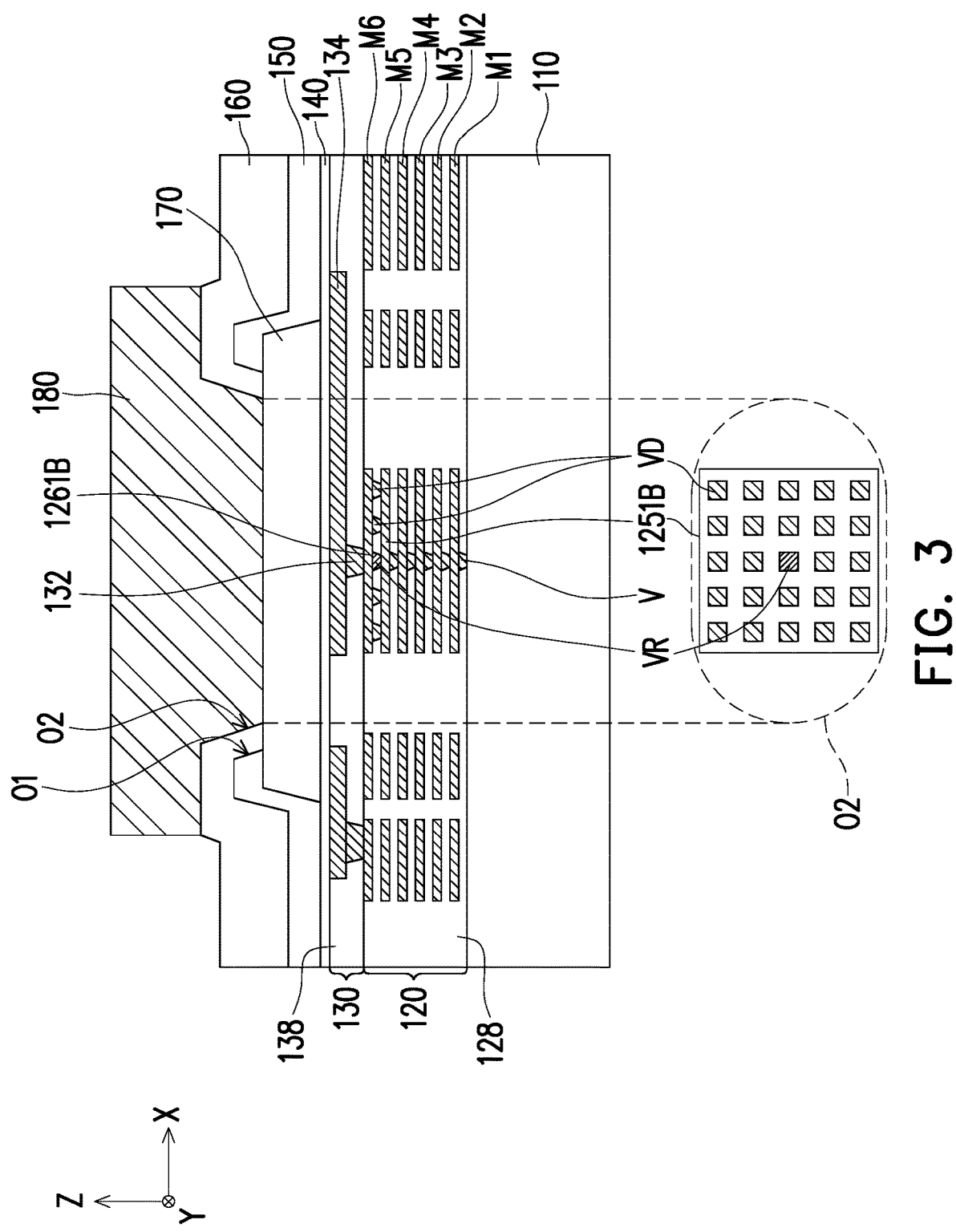
FIG. 3 illustrates a schematic cross sectional view of the semiconductor die in accordance with some other embodiments of the present application.

FIG. 3 illustrates a schematic cross sectional view of the semiconductor die in accordance with some other embodiments of the present application. In some embodiments, the semiconductor die 10B of FIG. 3 is similar to the semiconductor die 10 illustrated in FIG. 1, except that the first via VR and the second vias VD are electrically connected. Specifically, the interconnect wiring M6 includes a conductive portion 1261B. The interconnect wiring M5 includes a conductive portion 1251B. The first via VR electrically connects to the conductive portion 1261B and the conductive portion 1251B. The second vias VD electrically connect to the conductive portion 1261B and the conductive portion 1251B. Therefore, the first via VR and the second vias VD are electrically connected to each other, and the second vias VD may be used to conduct electrical signals the same as the first via VR. Therefore, the second vias VD may be used to support the first via VR, releasing the stress on the first via VR, and may also have electrical properties. Thus, the structural quality and the electrical quality of the semiconductor die 10B are further improved.

According to a top view of the opening O2, the first vias VR and the second vias VD are arranged in an array. The array of vias are arranged in to a 5×5 grid, but not limited thereto. In some embodiments, the first vias VR and the second vias VD are disposed within the edge of the opening O2, nut not limited thereto. According to the above configurations, the second vias VD may release the stress on the first via VR. Thus, the structural quality and the electrical quality of the semiconductor die 10B are further improved.

Figure 4:
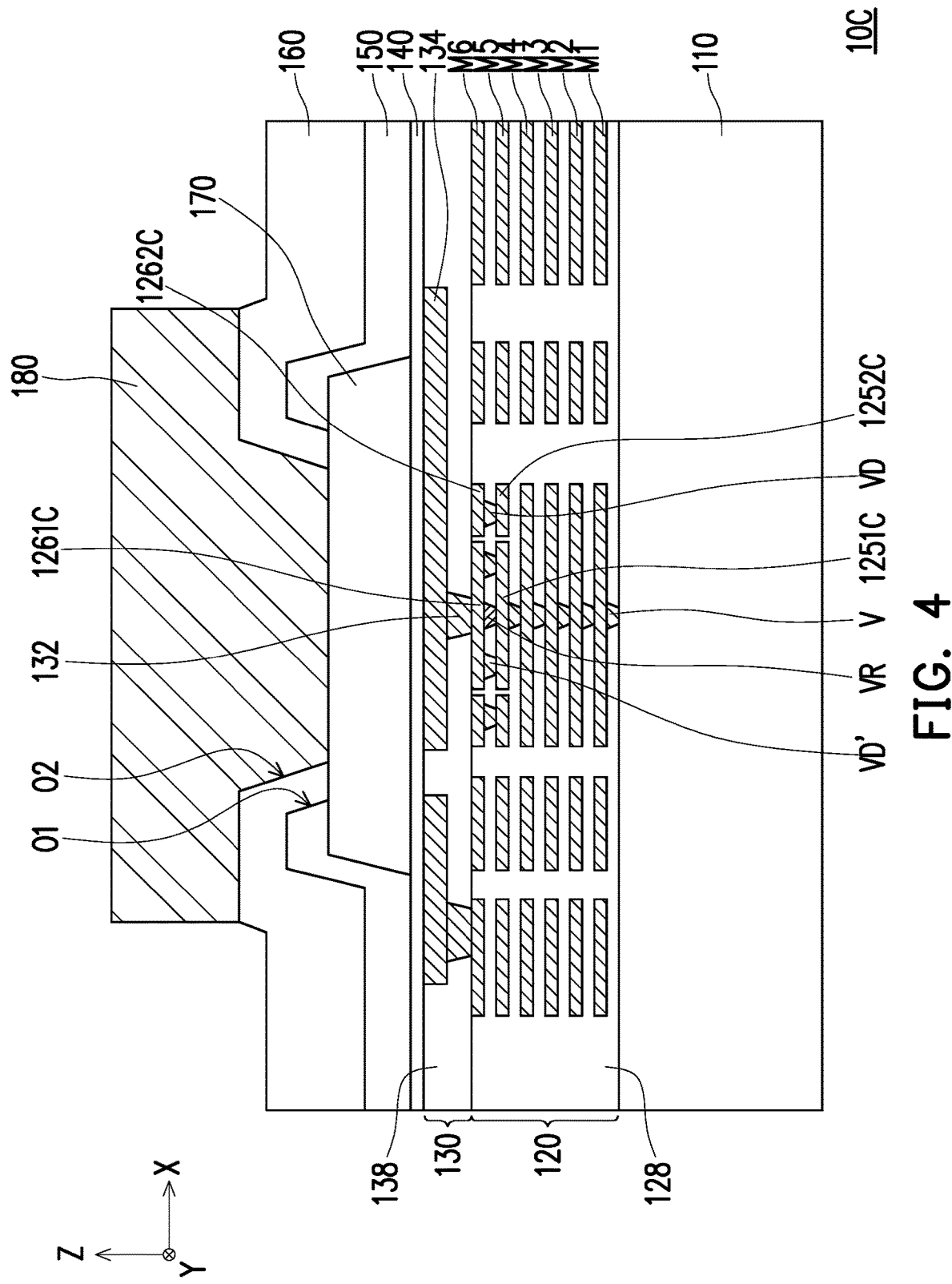
FIG. 4 illustrates a schematic cross sectional view of the semiconductor die in accordance with some other embodiments of the present application.

FIG. 4 illustrates a schematic cross sectional view of the semiconductor die in accordance with some other embodiments of the present application. In some embodiments, the semiconductor die 10C of FIG. 4 is similar to the semiconductor die 10 illustrated in FIG. 1, except that the first via VR and the second vias VD' are electrically connected. Specifically, the interconnect wiring M6 includes a conductive portion 1261C and peripheral portions 1262C. The peripheral portions 1262C are disposed on opposite ends of the conductive portion 1261C. The interconnect wiring M5 includes a conductive portion 1251C and peripheral portions 1252C. The peripheral portions 1252C are disposed on opposite ends of the conductive portion 1251C.

The first via VR and several second vias VD' are electrically connected to the conductive portion 1261C and the conductive portion 1251C. That is to say, the first via VR electrically connects to the adjacent second vias VD'. Other second vias VD are electrically connected to the peripheral portion 1662C and the peripheral portion 1252C. Under the above configurations, the first via VR and its adjacent second vias VD' are used for support and electrical conduction. The second vias VD around the first via VR and its adjacent second vias VD' near the center are used for support and stress release. Thus, a balance of the structural quality and the electrical quality of the semiconductor die 10C is further improved.

Figure 5:
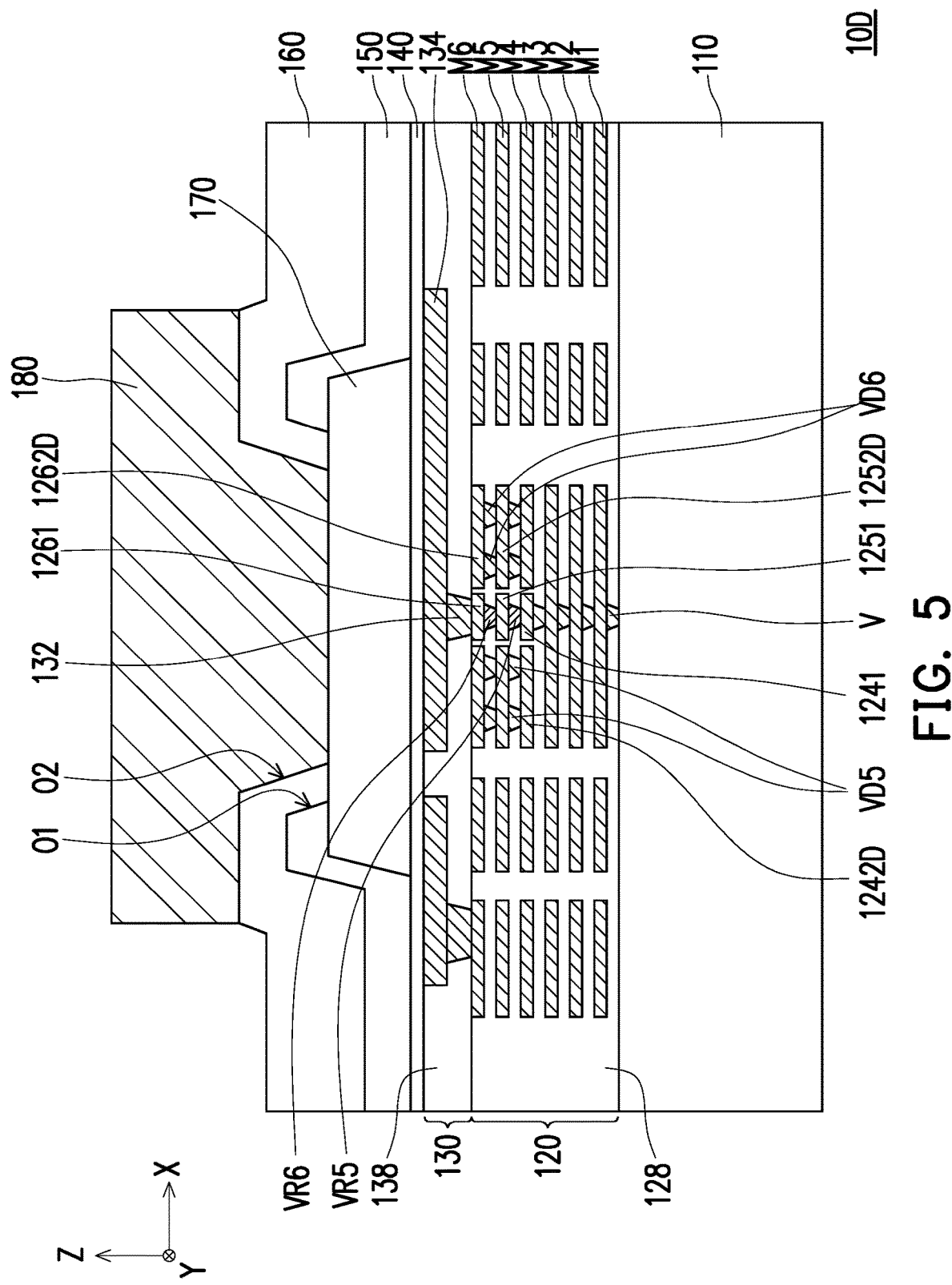
FIG. 5 illustrates a schematic cross sectional view of the semiconductor die in accordance with some other embodiments of the present application.

FIG. 5 illustrates a schematic cross sectional view of the semiconductor die in accordance with some other embodiments of the present application. In some embodiments, the semiconductor die 10D of FIG. 5 is similar to the semiconductor die 10 illustrated in FIG. 1, except that the plurality of second vias VD5, VD6 are disposed on different horizontal planes, or different level heights. In addition, the second vias VD5, VD6 on different horizontal planes are connected to each other. Specifically, the interconnect wiring M6 includes a conductive portion 1261 and peripheral portions 1262D on opposite ends of the conductive portion 1261. The peripheral portions 1262D are electrically insulated from the conductive portion 1261. Similarly, the interconnect wiring M5 includes a conductive portion 1251 and peripheral portions 1252D on opposite ends of the conductive portion 1251. The interconnect wiring M4 includes a conductive portion 1241 and peripheral portions 1242D on opposite ends of the conductive portion 1241. On the Z-axis, the conductive portion 1261 overlaps the conductive portion 1251, and the conductive portion 1251 overlaps the conductive portion 1241. On the Z-axis, the peripheral portions 1262D overlaps the peripheral portions 1252D, and the peripheral portions 1252D overlaps the peripheral portions 1242D.

In some embodiments, the first via VR6 is connected to the conductive portion 1261 and the conductive portion 1251. The second vias VD6 are disposed around the first via VR6, and the plurality of second vias VD6 connect the peripheral portion 1262D and the peripheral portion 1252D. That is to say, the second vias VD6 connecting to the same peripheral portion 1262D are connected to each other. In some embodiments, the first via VR6 is between the conductive portion 1261 and the conductive portion 1251 which are overlapped with each other. The second vias VD6 are disposed between the peripheral portion 1262 and the peripheral portion 1252 which are overlapped with each other. Thus, the first via VR6 and the second vias VD6 are substantially on the same level height.

The first via VR5 is connected to the conductive portion 1251 and the conductive portion 1241. The second vias VD5 are disposed around the first via VR5, and the plurality of second vias VD5 connect the peripheral portion 1252D and the peripheral portion 1242D. That is to say, the second vias VD5 connecting to the same peripheral portion 1252D are connected to each other. In some embodiments, the first via VR5 is disposed between the conductive portion 1251 and the conductive portion 1241 which are overlapped with each other. The second vias VD5 are disposed between the peripheral portion 1252 and the peripheral portion 1242 which are overlapped with each other. Thus, the first via VR5 and the second vias VD5 are substantially on the same level height.

Under the above configurations, the semiconductor die 10D includes at least two interconnect layers with overlapping first vias VR5, VR6, and overlapping second vias VD5, VD6. For example, the first via VR6 is disposed over the first via VR5. The second vias VD6 is disposed over the second vias VD5. The second vias VD6 and the second vias VD5 are on different level heights. Thereby, multiple layers of the second vias VD5, VD6 are used to support and release the stress from the first vias VR5, VR6. Thus, the structural quality and the electrical quality of the semiconductor die 10D are further improved.

Figure 6:
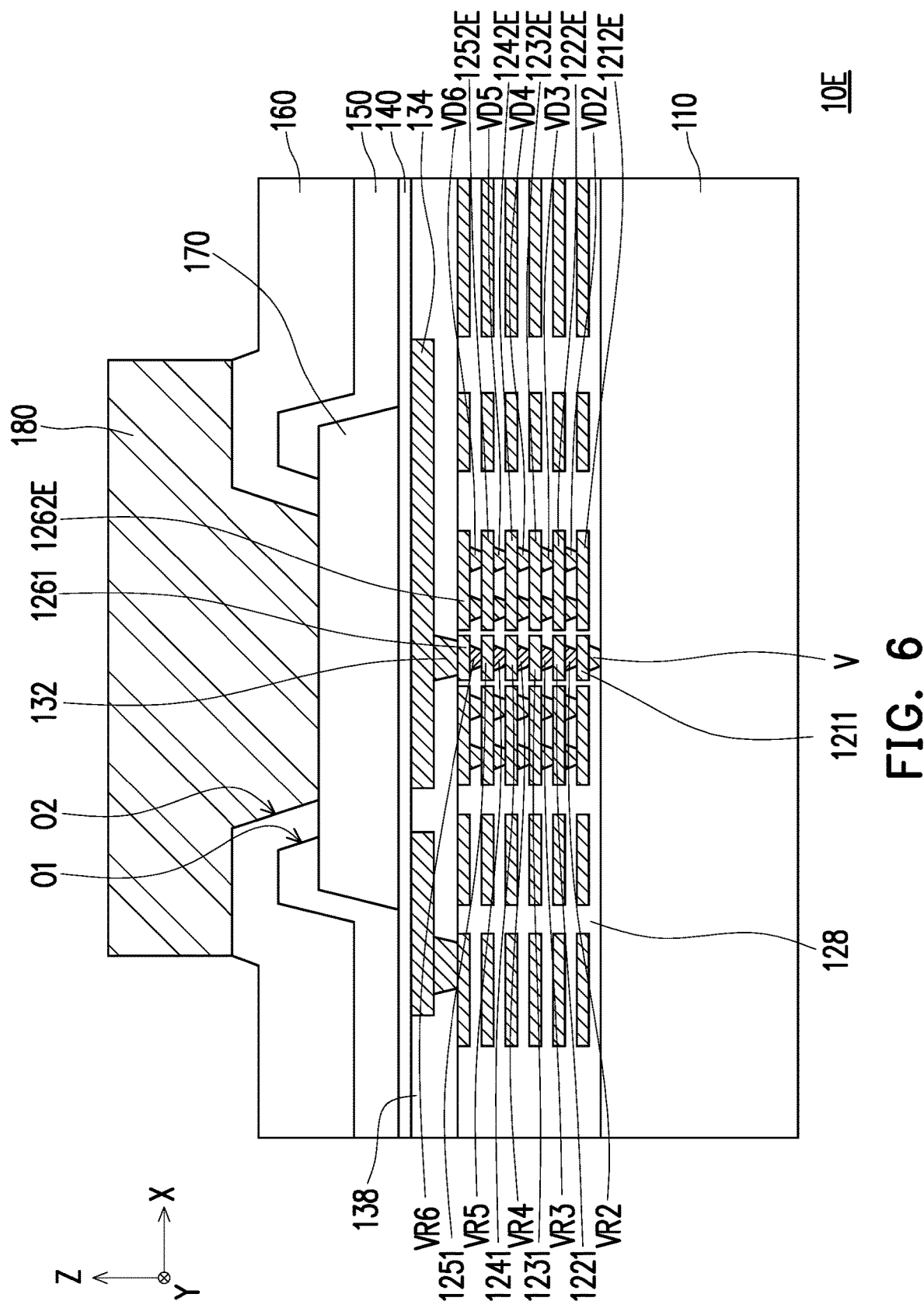
FIG. 6 illustrates a schematic cross sectional view of the semiconductor die in accordance with some other embodiments of the present application.

FIG. 6 illustrates a schematic cross sectional view of the semiconductor die in accordance with some other embodiments of the present application. In some embodiments, the semiconductor die 10E of FIG. 6 is similar to the semiconductor die 10D illustrated in FIG. 5, except that at least five layers of second vias on different level heights are stacked. Specifically, the interconnect wiring M6 includes a conductive portion 1261 and peripheral portions 1262E on opposite ends of the conductive portion 1261. The peripheral portions 1262E are electrically insulated from the conductive portion 1261. Similarly, the interconnect wiring M5 includes a conductive portion 1251 and peripheral portions 1252E on opposite ends of the conductive portion 1251. The interconnect wiring M4 includes a conductive portion 1241 and peripheral portions 1242E on opposite ends of the conductive portion 1241. The interconnect wiring M3 includes a conductive portion 1231 and peripheral portions 1232E on opposite ends of the conductive portion 1231. The interconnect wiring M2 includes a conductive portion 1221 and peripheral portions 1222E on opposite ends of the conductive portion 1221. The interconnect wiring M1 includes a conductive portion 1211 and peripheral portions 1212E on opposite ends of the conductive portion 1211. On the Z-axis, the conductive portion 1261 overlaps the conductive portion 1251, the conductive portion 1241, the conductive portion 1231, the conductive portion 1221, and the conductive portion 1211. On the Z-axis, the peripheral portions 1262E overlaps the peripheral portions 1252E, the peripheral portions 1242E, the peripheral portions 1232E, the peripheral portions 1222E, and the peripheral portions 1212E.

From top to bottom on the Z-axis, the conductive portion 1261, the first via VR6, the conductive portion 1251, the first via VR5, the conductive portion 1241, the first via VR4, the conductive portion 1231, the first via VR3, the conductive portion 1221, the first via VR2, the conductive portion 1211 and the third via V are sequentially stacked and form the electrical path.

From top to bottom on the Z-axis, the peripheral portion 1262E, the second via VD6, the peripheral portion 1252E, the second via VD5, the peripheral portion 1242E, the second via VD4, the peripheral portion 1232E, the second via VD3, the peripheral portion 1222E, the second via VD2, and the peripheral portion 1212E are sequentially stacked. The second vias VD2, VD3, VD4, VD5, VD6 are correspondingly overlapped with each other, but not limited thereto.

Under the above configurations, the semiconductor die 10E includes at least five interconnect layers with overlapping first vias VR2, VR3, VR4, VR5, VR6, and overlapping second vias VD2, VD3, VD4, VD5, VD6. Thereby, multiple layers of the second vias VD2, VD3, VD4, VD5, VD6 are used to support and release the stress of the first vias VR2, VR3, VR4, VR5, VR6. Thus, the structural quality and the electrical quality of the semiconductor die 10E are further improved.

Figure 7:
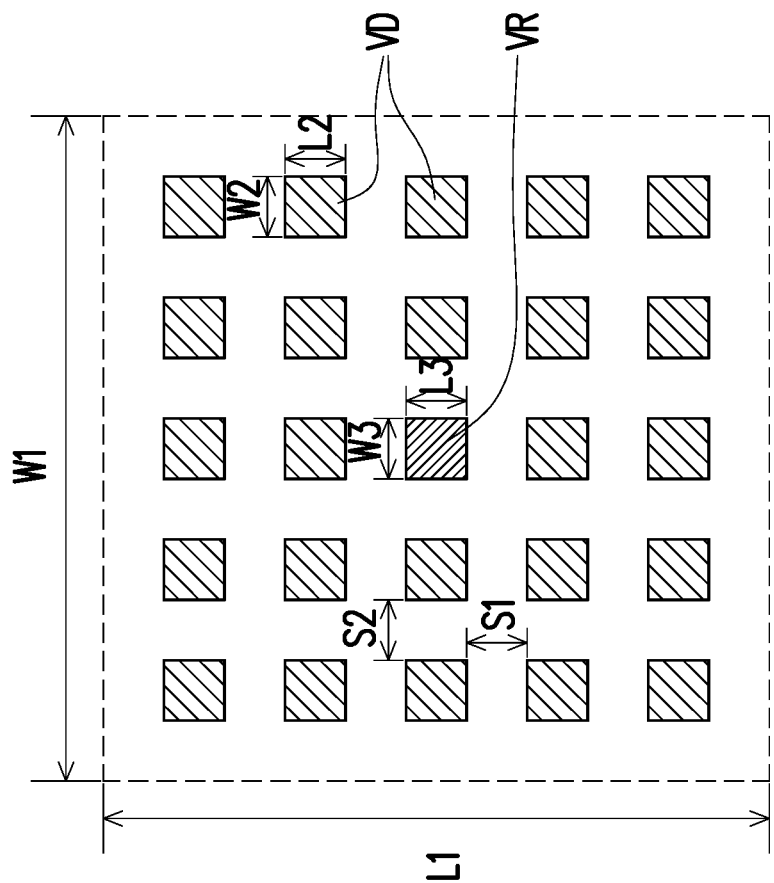
FIG. 7 illustrates a top view of the semiconductor die in accordance with some embodiments of the present application.

FIG. 7 illustrates a top view of the semiconductor die in accordance with some embodiments of the present application. In some embodiments, the semiconductor die 10F of FIG. 7 is similar to the semiconductor die 10 illustrated in FIG. 1, except that in FIG. 7, the top view of the first via VR and the second vias VD are shown. Please refer to FIG. 1 and FIG. 7, specifically the first via VR and the second vias VD are disposed in an area under the opening O2 of the insulating layer 160. Under the above configurations, the second vias VD are used to support the first via VR and release the stress from the conductive bump 180, the conductive pad 170, and the metallization via 132 acting on the first via VR.

In some embodiments, the area where the first via VR and the second vias are disposed is on the same level height, which is on a plane of the interconnect wire M5 under the opening O2, but not limited thereto. The area may be defined by a length L1 and a width W1. The length L1 extends along the Y-axis, and the width W1 extends along the X-axis. In some embodiments, the length L1 and the width W1 may be substantially the same. That is to say, the area is square shaped, but not limited thereto. In some embodiments, the area is rectangular shaped, diamond shaped, triangular shaped, or circular shaped.

The area defined by the length L1 and the length L2 is in the opening O2 when viewed from the Z-axis. That is to say, the area defined by the length L1 and the length L2 is smaller or equal to the area of the opening O2 on the Z-axis, but not limited thereto.

In the area defined by the length L1 and the length L2, the first via VR is disposed in the center, and the second vias VD are arranged to surround or disposed around the first via VR. For example, the second vias VD are arranged in rows and columns in accordance to the X-axis and the Y-axis. In some embodiments, five rows of the second vias VD and five columns of the second vias VD are disposed in an array, and the first via VR is located in the middle surrounded by four adjacent second vias VD. In some embodiments, twenty-four second vias VD are disposed in the area, but the number of the second vias VD are not limited thereto.

Each of the second vias VD may be defined by a length L2 and a width W2. The length L2 extends along the Y-axis, and the width W2 extends along the X-axis. The first via VR may be defined by a length L3 and a width W3. The length L3 extends along the Y-axis, and the width W3 extends along the X-axis. An area of each of the second via VD may be substantially similar to an area of the first via VR. For example, the length L3 of the first via VR is substantially the same as the length L2 of the second via VD. The length L2 or the length L3 is in a range of 0.09 μm to 0.106 but not limited thereto. The width L3 of the first via VR is substantially the same as the width W2 of the second via VD. The width W2 or the width W3 is in a range of 0.09 μm to 0.106 but not limited thereto.

Two adjacent second vias VR are separated by a space S1 on the Y-axis, and separated by a space S2 on the X-axis. In some embodiments, the first via VR and the second via VD is separated by the space S1 on the Y-axis, and separated by the space S2 on the X-axis, but not limited thereto. The space S1 and the space S2 may be substantially the same. For example. the space S1 or the space S2 is in a range of 0.18 μm to 0.334 but not limited thereto.

In an embodiment of the present application, the length L1 corresponds to the number of the second vias VD and the spaces S1 between the second vias VD. The width W1 corresponds to the number of the second vias VD and the spaces S2 between the second vias VD. For example, the length L1 may be larger than a product of the number of the second vias VD in a column and the sum of the length L2 and the space S1. According to an embodiment of the present application, the length L1 is larger than at least five times the sum of the length L2 and the space S1, but not limited thereto. Alternatively, the length L1 is ranged from 1.43 μm to 2.12 μm, but not limited thereto.

The width W1 may be larger than a product of the number of the second vias VD in a row and the sum of the width W2 and the space S2. According to an embodiment of the present application, the width W1 is larger than at least five times the sum of the width W2 and the space S2, but not limited thereto. Alternatively, the width W1 is ranged from 1.43 μm to 2.12 μm, but not limited thereto. It should be noted that the numbers of the second vias VD is not limited by the number shown in FIG. 7. Other possible forms and patterns of the first vias and the second vias VD may be utilized according to design requirements.

Under the above configurations, the semiconductor die 10 and the semiconductor die 10F may use the second vias VD to support the first vias in an area under the opening O2, where the stress of the conductive bump 180, the bond 170, and the top metal via 132 is centered. Therefore, the stress acting on the first via VR is released by the second vias VD, thus the stress is reduced, and the structural quality and the electrical quality of the semiconductor die 10, 10F are improved.

Figure 8:
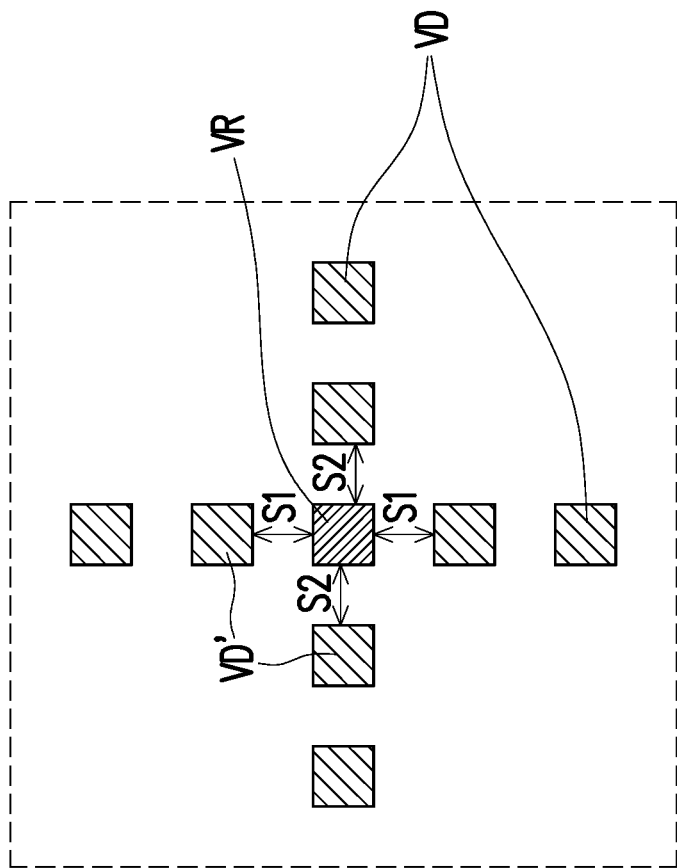
FIG. 8 illustrates a top view of the semiconductor die in accordance with some other embodiments of the present application.
Figure 8:
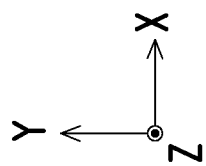

FIG. 8 illustrates a top view of the semiconductor die in accordance with some other embodiments of the present application. In some embodiments, the semiconductor die 10G of FIG. 8 is similar to the semiconductor die 10F illustrated in FIG. 7, except that the second vias VD, VD' and the first via VR are arranged in a cross shape. Specifically, one column of the second vias VD, VD' and one row of the second vias VD, VD' are arranged to surround the first via VR. Four second vias VD' are adjacent to and surround the first via VR. The second via VD' is spaced apart from the first via VR by a space S1 on the Y-axis, and by a space S2 on the X-axis. The second vias VD are disposed further away from the first VR than the second vias VD'. The second vias VD, VD' and the first via VR form a row and a column centered on the first via VR, but not limited thereto.

Figure 9:
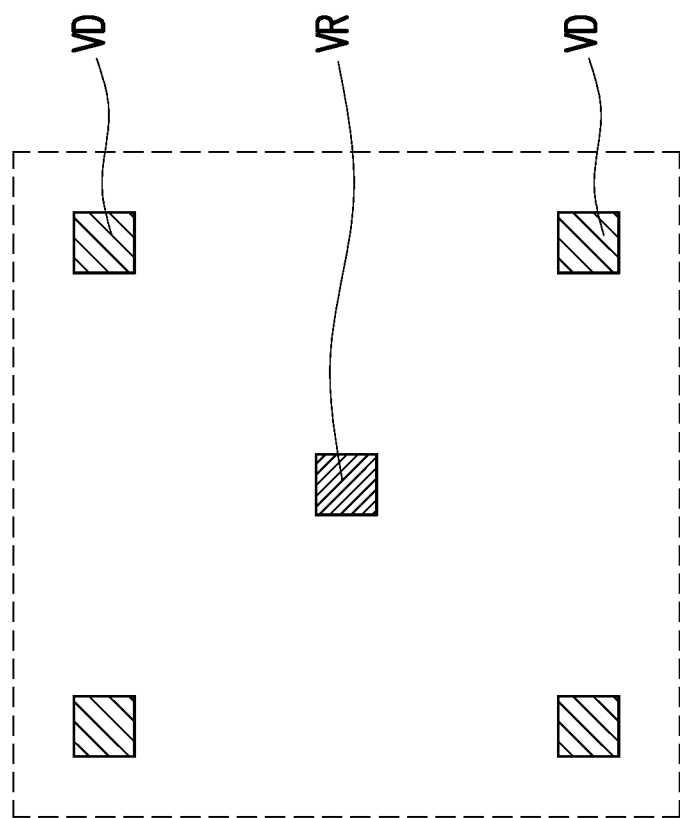
FIG. 9 illustrates a top view of the semiconductor die in accordance with some other embodiments of the present application.

FIG. 9 illustrates a top view of the semiconductor die in accordance with some other embodiments of the present application. In some embodiments, the semiconductor die 10H of FIG. 9 is similar to the semiconductor die 10F illustrated in FIG. 7, except that the second vias VD are disposed at the four corners of the area where the first via VR and the second vias VD are disposed. The four second vias VD are disposed around the first via VR diagonally, but not limited thereto.

Figure 10:
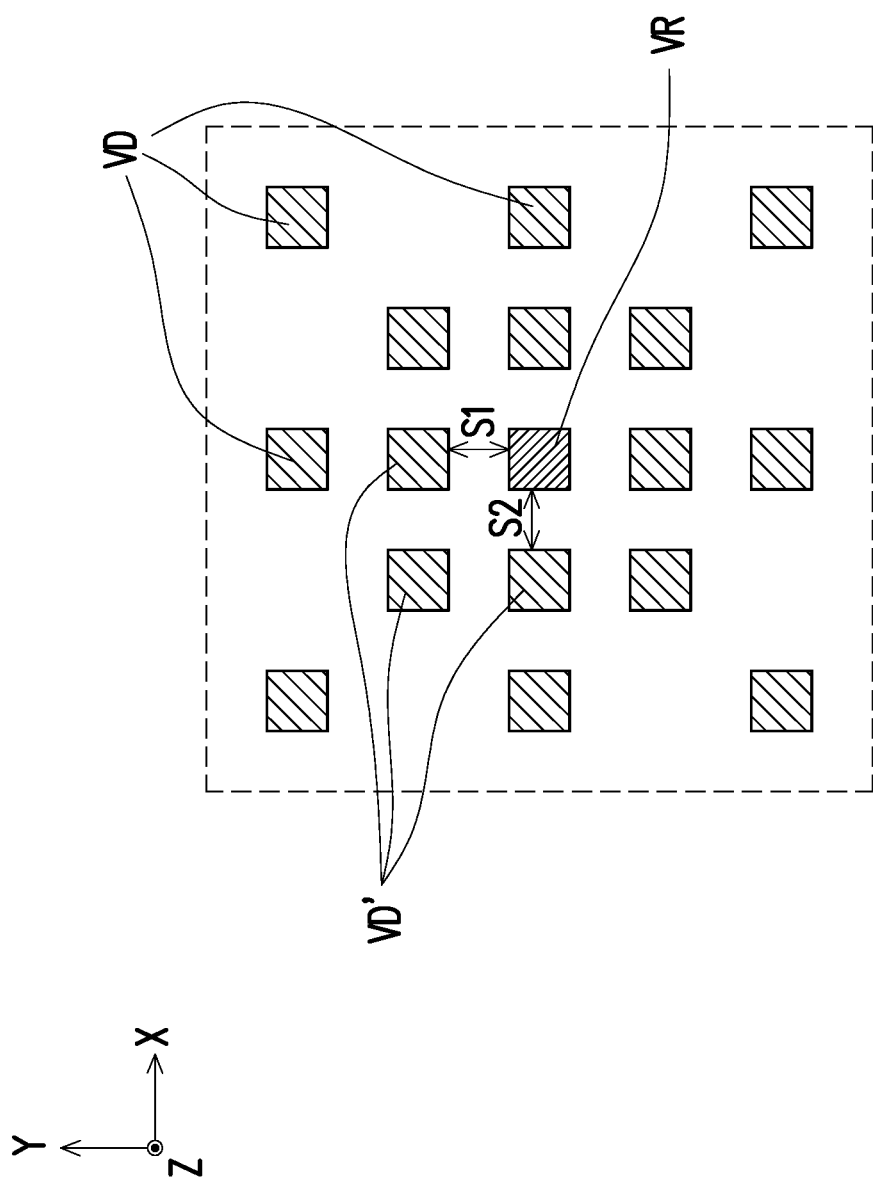
FIG. 10 illustrates a top view of the semiconductor die in accordance with some other embodiments of the present application.

FIG. 10 illustrates a top view of the semiconductor die in accordance with some other embodiments of the present application. In some embodiments, the semiconductor die 10I of FIG. 10 is similar to the semiconductor die 10F illustrated in FIG. 7, except that an inner ring of the second vias VD' disposed adjacent to the first via VR is centered on and surrounded the first via VR. The inner ring of the second vias VD' is composed of eight second vias VD' surround the first via VR.

An outer ring of the second vias VD is centered on and surrounded the inner ring of the second vias VD'. The inner ring of the second vias VD' is between the outer ring of the second vias VD and the first via VR, but not limited thereto. The outer ring of the second vias VD is composed of eight second vias VD, with three second vias VD disposed evenly on each of the four side of the area, but not limited thereto.

Figure 11:
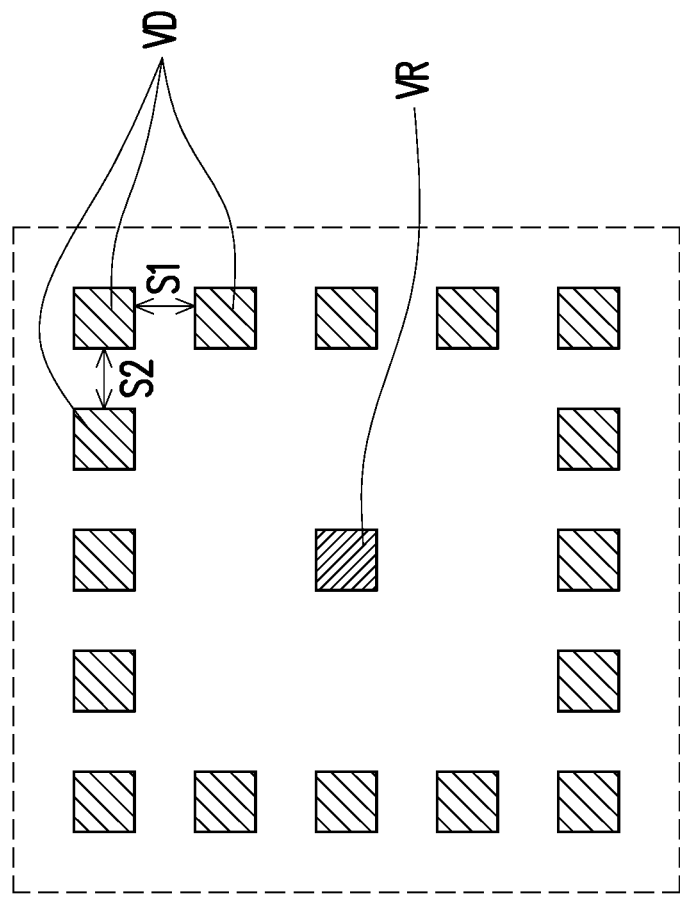
FIG. 11 illustrates a top view of the semiconductor die in accordance with some other embodiments of the present application.
Figure 11:
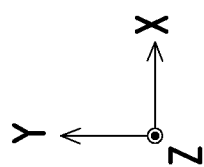

FIG. 11 illustrates a top view of the semiconductor die in accordance with some other embodiments of the present application. In some embodiments, the semiconductor die 10J of FIG. 11 is similar to the semiconductor die 10F illustrated in FIG. 7, except that an outer ring of the second vias VD is center on and surrounded the first via VR. The second vias VD are spaced apart by the space S1 on the Y-axis and by the space S2 on the X-axis. The second vias VD may be disposed at the four corners of the area. The outer ring of the second vias VD may be a square ring, with two columns of the second vias VD disposed along the Y-axis on two sides, and two rows of the second vias VD disposed along the X-axis on the other two sides, but not limited thereto.

Figure 12:
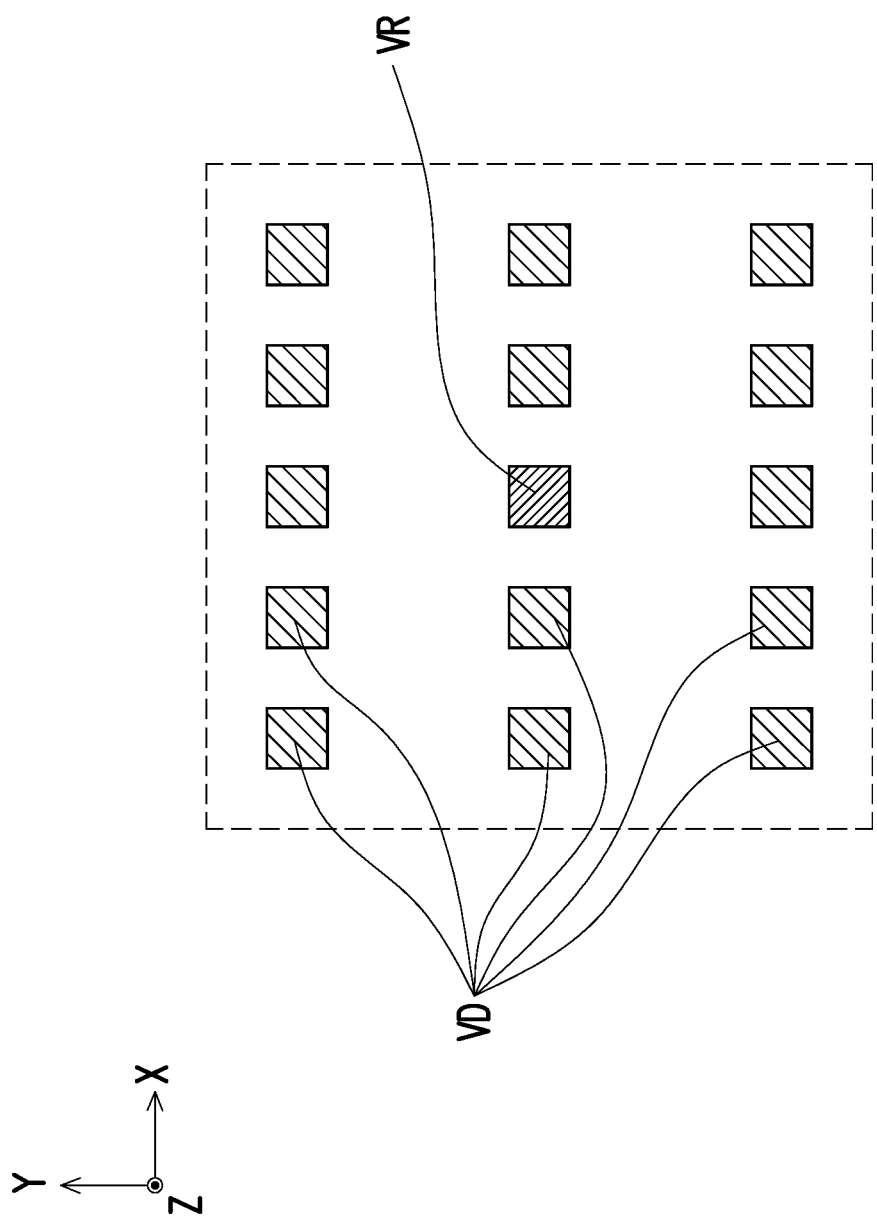
FIG. 12 illustrates a top view of the semiconductor die in accordance with some other embodiments of the present application.

FIG. 12 illustrates a top view of the semiconductor die in accordance with some other embodiments of the present application. In some embodiments, the semiconductor die 10K of FIG. 12 is similar to the semiconductor die 10F illustrated in FIG. 7, except that the second vias VD are arranged into three rows extending along the X-axis. The three tows of the second vias VD are arranged on the Y-axis from top to bottom of the area. The middle row of the second vias VD is between the top row of the second vias VD and the bottom row of the second vias. The middle row of the second vias VD includes the first via VR. For example. two second vias VD are on the left side of the first via VR and two second vias VD are on the right side of the first via VR, but not limited thereto.

In the above-mentioned embodiments, since the stress of the conductive bump, the conductive pad, and the metallization via is centered around and under the openings of the passivation layers, the first via and the third vias under the openings are acted on by the stress of the conductive bump, the conductive pad, and the metallization via. The semiconductor die provides the second vias disposed adjacent to the first via on the same level height under the opening and the conductive bump so as to provide support to the first vias. Thus, the stress acting on the first via and third vias is released by the second vias, thus the stress on the first via is reduced. Therefore, the risk of cracking the first via, the dielectric layer, conductive portions of the metallization patterns and third vias are reduced. The structural quality and the electrical quality of the semiconductor die are improved.

In accordance with some embodiments of the application, a semiconductor die includes a semiconductor substrate, an interconnect structure, and a conductive bump. The interconnect layer is disposed on and electrically connected to the semiconductor substrate. The interconnect structure includes stacked interconnect layers. Each of the interconnect layers includes a dielectric layer and an interconnect wiring embedded in the dielectric layer. The interconnect wiring of a first interconnect layer among the stacked interconnect layers further includes a first via and second vias. The first via electrically connected to the interconnect wiring. The second vias are connected to the interconnect wiring. The first via and the second vias are located on a same level height. The conductive bump is disposed on the interconnect structure. The conductive bump includes a base portion and a protruding portion connected to the base portion. The base portion is between the protruding portion and the first via.

In accordance with some embodiments of the application, a semiconductor die includes a semiconductor substrate, an interconnect structure disposed on and electrically connected to the semiconductor substrate, an insulating layer, and a metallization pattern. The interconnect structure includes a first interconnect layer and a second interconnect layer. The first first interconnect layer includes a first dielectric layer, a first interconnect wiring embedded in the first dielectric layer, a first via, and second vias. The second interconnect layer is disposed on the first interconnect layer. The second interconnect layer includes a second dielectric layer and a second interconnect wiring embedded in the second dielectric layer. The first via is disposed between the first interconnect wiring and the second interconnect wiring, the first via electrically connects the first interconnect wiring to the second interconnect wiring, and the second vias are disposed between the first interconnect wiring and the second interconnect wiring. The insulating layer and the metallization pattern are disposed on the interconnect structure. The metallization pattern is embedded in the insulating layer. The first dielectric layer is a topmost layer of the intetconnect structure. The insulating layer is disposed over the first dielectric layer, and a dielectric constant of the first dielectric layer is less than a dielectric constant of the insulating layer. The first via and the second vias are embedded in the first dielectric layer. The first via is spaced apart from the second vias.

In accordance with some embodiments of the application, a semiconductor die includes a semiconductor substrate, am interconnect structure, and a conductive pad. The interconnect structure is disposed on and electrically connected to the semiconductor substrate. The interconnect structure includes a first interconnect layer, and a second interconnect layer. The first interconnect layer includes a first dielectric layer, a first interconnect wiring embedded in the first dielectric layer, a conduction via, and at least one stress release via. The second interconnect layer includes a second dielectric layer, and a second interconnect wiring embedded in the second dielectric layer. The conduction via is disposed between the first interconnect wiring and the second interconnect wiring. The at least one stress release via is disposed between the first interconnect wiring and the second interconnect wiring. The conductive pad disposed on the interconnect structure. The conductive pad is electrically connected to the conduction via. The conduction via and the at least one stress release via are embedded in the first dielectric layer.

The foregoing outlines features of several embodiments so that those skilled in the art may better understand the aspects of the present application. Those skilled in the art should appreciate that they may readily use the present application as a basis for designing or modifying other processes and structures for carrying out the same purposes and/or achieving the same advantages of the embodiments introduced herein. Those skilled in the art should also realize that such equivalent constructions do not depart from the spirit and scope of the present application, and that they may make various changes, substitutions, and alterations herein without departing from the spirit and scope of the present application.

What is claimed is:

1. A semiconductor die, comprising:
   a semiconductor substrate,
   an interconnect structure disposed on and electrically connected to the semiconductor substrate, the interconnect structure comprising:
   stacked interconnect layers, each of the stacked interconnect layers comprising a dielectric layer and an interconnect wiring embedded in the dielectric layer, wherein the interconnect wiring of a first interconnect layer among the stacked interconnect layers further comprises:
   a first via electrically connected to the interconnect wiring;
   second vias connected to the interconnect wiring, wherein the first via and the second vias are located on a same level height, wherein the second vias are electrically insulated from the first via; and
   a conductive bump disposed on the interconnect structure, wherein the conductive bump comprises a base portion and a protruding portion connected to the base portion, and the base portion is between the protruding portion and the first via.

2. The semiconductor die of claim 1, wherein the interconnect structure further comprises:
   a second interconnect layer among the stacked interconnect layers, the second interconnect layer being disposed under the first interconnect layer, and the second interconnect layer comprising:
   a second dielectric layer;
   a second interconnect wiring; and
   a third via electrically connected to the second interconnect wiring, wherein the third via overlaps the first via.

3. The semiconductor die of claim 2, wherein the interconnect wiring of the first interconnect layer comprises a first conductive portion and a first peripheral portion electrically insulated from the first peripheral portion, the first conductive portion connects to the first via, and the first peripheral portion connects to at least one of the second vias.

4. The semiconductor die of claim 3, wherein the interconnect wiring of the second interconnect layer comprises a second conductive portion and a second peripheral portion electrically insulated from the second conductive portion, the second conductive portion connects to the first via and the third via, and the second peripheral portion connects to at least one of the second vias.

5. The semiconductor die of claim 1, wherein the dielectric layer has a dielectric constant between 2.0 to 3.0.

6. The semiconductor die of claim 1, further comprising an insulating layer and a metallization pattern embedded in the insulating layer, wherein the metallization pattern is disposed between the interconnect structure and the conductive bump.

7. The semiconductor die of claim 6, further comprising a metallization via, the metallization via electrically connected the interconnect structure to metallization pattern.

8. The semiconductor die of claim 7, wherein the first via is disposed under the metallization via.

9. The semiconductor die of claim 1, further comprising a conductive pad disposed between the interconnect structure and the conductive bump, wherein the conductive pad is electrically connected to the interconnect structure and the conductive bump.

10. The semiconductor die of claim 9, further comprising a first passivation layer and a second passivation layer, the first passivation layer is disposed on the interconnect structure, the second passivation layer is disposed on the first passivation layer, and the conductive pad is covered by the second passivation layer.

11. The semiconductor die of claim 1, further comprising another insulating layer, wherein the protruding portion of the conductive bump is disposed over the another insulating layer, the base portion of the conductive bump is embedded in the another insulating layer, and the base portion electrically connects to the conductive pad.

12. A semiconductor die, comprising:
a semiconductor substrate,
an interconnect structure disposed on and electrically connected to the semiconductor substrate, the interconnect structure comprising:
   a first interconnect layer comprising a first dielectric layer, a first interconnect wiring embedded in the first dielectric layer, a first via and second vias; and
   a second interconnect layer disposed on the first interconnect layer, the second interconnect layer comprising a second dielectric layer and a second interconnect wiring embedded in the second dielectric layer, wherein the first via is disposed between the first interconnect wiring and the second interconnect wiring, the first via electrically connects the first interconnect wiring to the second interconnect wiring, and the second vias are disposed between the first interconnect wiring and the second interconnect wiring; and
an insulating layer and a metallization pattern disposed on the interconnect structure, wherein the metallization pattern is embedded in the insulating layer,
wherein the first dielectric layer is a topmost layer of the interconnect structure, the insulating layer is disposed over the first dielectric layer, and a dielectric constant of the first dielectric layer is less than a dielectric constant of the insulating layer,
wherein the first via and the second vias are embedded in the first dielectric layer, and the first via is spaced apart from the second vias, and the second vias are electrically insulated from the first via.

13. The semiconductor die of claim 12, further comprising:
a conductive bump disposed on the interconnect structure, wherein the conductive bump comprises a base portion and a protruding portion connected to the base portion, and the base portion is between the protruding portion and the first via; and
a conductive pad disposed between the interconnect structure and the conductive bump, wherein the conductive pad is electrically connected to the interconnect structure and the base portion of the conductive bump.

14. The semiconductor die of claim 13, further comprising a first passivation layer and a second passivation layer, the first passivation layer is disposed on the interconnect structure, the second passivation layer is disposed on the first passivation layer, and the conductive pad is embedded in the second passivation layer.

15. The semiconductor die of claim 13, further comprising a metallization via electrically connected the interconnect structure to the metallization pattern, wherein the metallization pattern is between the interconnect structure and the conductive pad.

16. The semiconductor die of claim 15, wherein the first via, the second vias, and the metallization via are disposed under the base portion of the conductive bump.

17. The semiconductor die of claim 13, wherein the second vias are connected to the first interconnect wiring, and the second vias are connected to each other.

18. A semiconductor die, comprising:
a semiconductor substrate,
an interconnect structure disposed on and electrically connected to the semiconductor substrate, the interconnect structure comprising:
   a first interconnect layer comprising a first dielectric layer, a first interconnect wiring embedded in the first dielectric layer, a conduction via and at least one stress release via; and
   a second interconnect layer disposed on the first interconnect layer, the second interconnect layer comprising a second dielectric layer and a second interconnect wiring embedded in the second dielectric layer, wherein the conduction via is disposed between the first interconnect wiring and the second interconnect wiring, and the at least one stress release via is disposed between the first interconnect wiring and the second interconnect wiring; and
a conductive pad disposed on the interconnect structure, wherein the conductive pad is electrically connected to the conduction via,
wherein the conduction via and the at least one stress release via are embedded in the first dielectric layer, and the conduction via is electrically insulated from the at least one stress release via.

19. The semiconductor die of claim 18, further comprising:
a conductive bump disposed on the interconnect structure, wherein the conductive bump comprises a base portion and a protruding portion connected to the base portion, and the base portion is between the protruding portion and the first via; and
an insulating layer and a metallization pattern embedded in the insulating layer disposed between the interconnect structure and the conductive bump,
wherein the conduction via and the at least one stress release via are disposed under the base portion of the conductive bump.

20. The semiconductor die of claim 19, further comprising a first passivation layer disposed on the metallization pattern and a second passivation layer disposed on the first passivation layer, and the conductive pad is embedded in the second passivation layer.

* * * * *